United States Patent [19]
Takeuchi et al.

[11] Patent Number: 6,108,880
[45] Date of Patent: Aug. 29, 2000

[54] METHOD OF PRODUCING A PIEZOELECTRIC/ELECTROSTRICTIVE FILM ELEMENT HAVING CONVEX DIAPHRAGM PORTIONS

[75] Inventors: Yukihisa Takeuchi, Aichi-ken; Tsutomu Nanataki, Toyoake, both of Japan

[73] Assignee: NGK Insulators, Ltd., Japan

[21] Appl. No.: 09/175,405

[22] Filed: Oct. 20, 1998

Related U.S. Application Data

[62] Division of application No. 08/385,926, Feb. 9, 1995, Pat. No. 6,049,158.

[30] Foreign Application Priority Data

| Feb. 14, 1994 | [JP] | Japan | 6-17697 |
| Feb. 22, 1994 | [JP] | Japan | 6-24174 |
| Jun. 3, 1994 | [JP] | Japan | 6-122732 |
| Aug. 11, 1994 | [JP] | Japan | 6-189203 |
| Oct. 5, 1994 | [JP] | Japan | 6-241172 |

[51] Int. Cl.[7] ................................................ H01L 41/22
[52] U.S. Cl. .................... 29/25.35; 310/324; 310/330; 310/358
[58] Field of Search ................... 29/25.35; 310/324, 310/328, 330, 358

[56] References Cited

U.S. PATENT DOCUMENTS

| 4,525,464 | 6/1985 | Claussen et al. ..................... 501/103 |
| 5,089,455 | 2/1992 | Ketcham et al. . |
| 5,210,455 | 5/1993 | Takeuchi et al. ..................... 310/328 |
| 5,774,961 | 7/1998 | Takeuchi et al. ..................... 310/328 X |

FOREIGN PATENT DOCUMENTS

| 0468796 | 1/1992 | European Pat. Off. . |
| 0526048 | 2/1993 | European Pat. Off. . |
| 0572230 | 12/1993 | European Pat. Off. . |
| 60-111600 | 6/1985 | Japan . |
| 62-213399 | 9/1987 | Japan . |
| 3-128681 | 5/1991 | Japan . |
| 5-49270 | 2/1993 | Japan . |
| 5-270912 | 10/1993 | Japan . |
| 2161647 | 1/1986 | United Kingdom . |

Primary Examiner—Carl E. Hall
Attorney, Agent, or Firm—Parkhurst & Wendel, L.L.P.

[57] ABSTRACT

A piezoelectric/electrostrictive film element which includes a ceramic substrate having at least one window and a diaphragm portion for closing each window, and a film-like piezoelectric/electrostrictive unit formed on the diaphragm portion. The diaphragm portion has a convex shape and protrudes outwards, in a direction away from the corresponding window. The piezoelectric/electrostrictive unit includes a lower electrode, a piezoelectric/electrostrictive layer and an upper electrode, which are formed in lamination in the order of description on a convex outer surface of the diaphragm portion by a film-forming method. A method of producing the piezoelectric/electrostrictive film element as described above.

3 Claims, 6 Drawing Sheets

METHOD OF PRODUCING A PIEZOELECTRIC/ELECTROSTRICTIVE FILM ELEMENT HAVING CONVEX DIAPHRAGM PORTIONS

This is a Division of application Ser. No. 08/385,926 filed Feb. 9, 1995, now U.S. Pat. No. 6,049,158.

BACKGROUND OF THE INVENTION

1. Field of the Invention

The present invention relates to a uni-morph, bi-morph or other type of a piezoelectric or electrostrictive film element which generates or detects displacement or force in the form of bending, deflection or flexure, and which can be used for actuators, filters, display devices, transformers, microphones, sounding bodies (such as loudspeakers), various resonators or vibrators, sensors and other components or devices. The term "element" used herein is an element which is capable of transducing or converting an electric energy into a mechanical energy, i.e., mechanical displacement, strain or vibrations, or transducing such a mechanical energy into an electric energy.

2. Discussion of Related Art

In recent years, in the fields of optics and precision positioning or machining operations, for example, there have been widely used and increasingly demanded an element whose displacement is controlled for adjusting or controlling an optical path length or a position of a member or component of a device, on the order of fractions of one micron ($\mu$m), and a detecting element adapted to detect infinitesimal displacement of a subject as an electric change. To meet the demand, there have been developed piezoelectric or electrostrictive film elements used for actuators or sensors, which elements comprise a piezoelectric material such as ferroelectric material, and utilize the reverse or converse piezoelectric effect to produce a mechanical displacement upon application of an electric field to the piezoelectric material, or utilize the piezoelectric effect so as to produce an electric field upon application of a pressure or mechanical stress. Among these elements, a conventional uni-morph type piezoelectric/electrostrictive film element has been favorably used for a loudspeaker, for example.

There have been proposed ceramic piezoelectric/electrostrictive film elements used for various purposes, as disclosed in JP-A-3-128681 and JP-A-5-49270 filed by the assignee of the present application. An example of the disclosed elements has a ceramic substrate which has at least one window, and is formed integrally with a thin diaphragm which closes the window or windows so as to provide at least one thin-walled diaphragm portion. On an outer surface of each diaphragm portion of the ceramic substrate, there is formed a piezoelectric/electrostrictive unit (hereinafter referred to as "P/E unit") which is an integral laminar structure consisting of a lower electrode, a piezoelectric/electrostrictive layer (hereinafter referred to as "P/E layer") and an upper electrode. This P/E unit is formed by a suitable film-forming method on the relevant diaphragm portion of the ceramic substrate. The thus formed piezoelectric/electrostrictive film element is relatively small-sized and inexpensive, and can be used as an electromechanical transducer having high operating reliability. Further, this element has a quick operating response, and provides a relatively large amount of displacement by application of a low voltage, with a relatively large magnitude of force generated. Thus, the above-described element is advantageously used as a member for an actuator, filter, display device, sensor or other component or device.

To produce the piezoelectric/electrostrictive film element as described above, the lower electrode, P/E layer and upper electrode of each P/E unit are laminated in this order on the diaphragm portion of the ceramic substrate by a suitable film-forming method, and is subjected to heat treatment (firing) as needed, so that the P/E unit is formed integrally on the diaphragm portion. A further study of the inventors of the present invention revealed that the thin-walled diaphragm portions of the thus constructed film element suffer from insufficient rigidness, reduced mechanical strength, and an accordingly reduced natural frequency, which results in a relatively slow operating response. Further, the piezoelectric/electrostrictive characteristics of the piezoelectric/electrostrictive film element are deteriorated due to the heat treatment (firing) effected during the formation of the P/E unit, more specifically, the P/E layer.

That is, the P/E layer suffers from stresses due to firing shrinkage of the P/E layer or P/E unit which is in contact with the diaphragm portion of the ceramic substrate, during the heat treatment of the P/E layer. As a result, the P/E layer may not be sufficiently sintered due to the stresses, and still suffers from stresses remaining therein after the firing. In this case, the piezoelectric/electrostrictive film element does not exhibit its inherent piezoelectric/electrostrictive characteristics.

To produce an actuator for a display device, for example, a plurality of windows are formed in a suitable pattern through a ceramic substrate, and P/E units as described above are formed on respective thin-walled diaphragm portions that close the corresponding windows. In this case, the diaphragm portions may be deflected upon firing of P/E layers of the P/E units, or the amount of displacement of the diaphragm portions may be considerably reduced due to stresses remaining in the P/E layers after firing thereof, particularly when two or more adjacent P/E units are actuated at the same time, as compared with when a single P/E unit is actuated. That is, when two adjacent P/E units are simultaneously actuated, for example, the displacement of a diaphragm portion which bears one of the two P/E units interferes with that of a diaphragm portion which bears the other P/E unit, resulting in reduction of the amounts of displacement of these diaphragm portions.

SUMMARY OF THE INVENTION

It is therefore a first object of the present invention to provide a piezoelectric/electrostrictive film element in which each piezoelectric/electrostrictive unit is formed by a film-forming method on an outer surface of a thin-walled diaphragm portion of a ceramic substrate, and which can convert strains or stresses arising in the P/E unit into displacement with high efficiency, and does not suffer from considerable reduction in the amount of displacement when two or more P/E units formed on respective diaphragm portions are actuated at the same time.

It is a second object of the invention to provide a method of producing such a piezoelectric/electrostrictive element that has excellent characteristics as described above.

The above-indicated first object may be accomplished according to a first aspect of the present invention, which provides a piezoelectric/electrostrictive film element comprising: (a) a ceramic substrate having at least one window, and a diaphragm portion formed as an integral part thereof, for closing each window, the diaphragm portion having a convex shape and protruding outwards, in a direction away from the corresponding window; and (b) a film-like piezoelectric/electrostrictive unit including a lower electrode, a piezoelectric/electrostrictive layer and an upper electrode, which are formed in lamination in the order of description on a convex outer surface of the diaphragm portion by a film-forming method.

In the piezoelectric/electrostrictive film element of the present invention constructed as described above, the diaphragm portion of the ceramic substrate which bears the piezoelectric/electrostrictive unit thereon exhibits effectively increased rigidity, with results of significant increases in the mechanical strength and natural frequency, and a favorably improved operating response of the element. This film element is capable of converting strains and strains arising in the piezoelectric/electrostrictive unit into displacement with high efficiency.

Further, where the present film element is provided with a plurality of piezoelectric/electrostrictive units, the amount of displacement of the element is not substantially reduced when two or more of the piezoelectric/electrostrictive units are simultaneously actuated, as compared with when a single piezoelectric/electrostrictive unit is actuated. Thus, the present film element provides substantially the same amount of displacement, assuring constant operating characteristics or quality, irrespective of the number of the piezoelectric/electrostrictive units which are being actuated.

In one preferred form of the present invention, an amount of protrusion of the diaphragm portion of the ceramic substrate is not greater than 5% of a length of a shortest line which extends across a corresponding one of the above-indicated at least one window and passes a center of the window.

In other preferred forms of the invention, the diaphragm portion has an average crystal grain size of not larger than 5 $\mu$m, the diaphragm portion has a thickness of not greater than 50 $\mu$m, and the piezoelectric/electrostrictive unit has a thickness of not greater than 100 $\mu$m.

In a further preferred form of the invention, the ceramic substrate has a plurality of windows, and a plurality of diaphragm portions for closing the windows, respectively, each of the diaphragm portions having a convex shape. In this case, the piezoelectric/electrostrictive unit is formed on a convex outer surface of each of the diaphragm portions of the substrate.

The above-described second object of the present invention may be accomplished according to a second aspect of the invention, which provides a method of producing a piezoelectric/electrostrictive film element including: a ceramic substrate having at least one window, and a diaphragm portion formed as an integral part thereof, for closing each window; and a film-like piezoelectric/electrostrictive unit including a lower electrode, a piezoelectric/electrostrictive layer and an upper electrode, which are formed in lamination in the order of description on an outer surface of the diaphragm portion, comprising the steps of: (a) preparing a ceramic substrate which has at least one diaphragm portion each of which has a convex shape and protrudes outwards, in a direction away from a corresponding one of the above-indicated at least one window; (b) forming a lower electrode and a piezoelectric/electrostrictive layer on a convex outer surface of each diaphragm portion by a film-forming method; (c) firing the piezoelectric/electrostrictive layer so that the lower electrode and the piezoelectric/electrostrictive layer are formed integrally on the convex outer surface of the diaphragm portion; and (d) forming the upper electrode on the piezoelectric/electrostrictive layer by a film-forming method.

BRIEF DESCRIPTION OF THE DRAWINGS

The above and optional objects, features and advantages of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
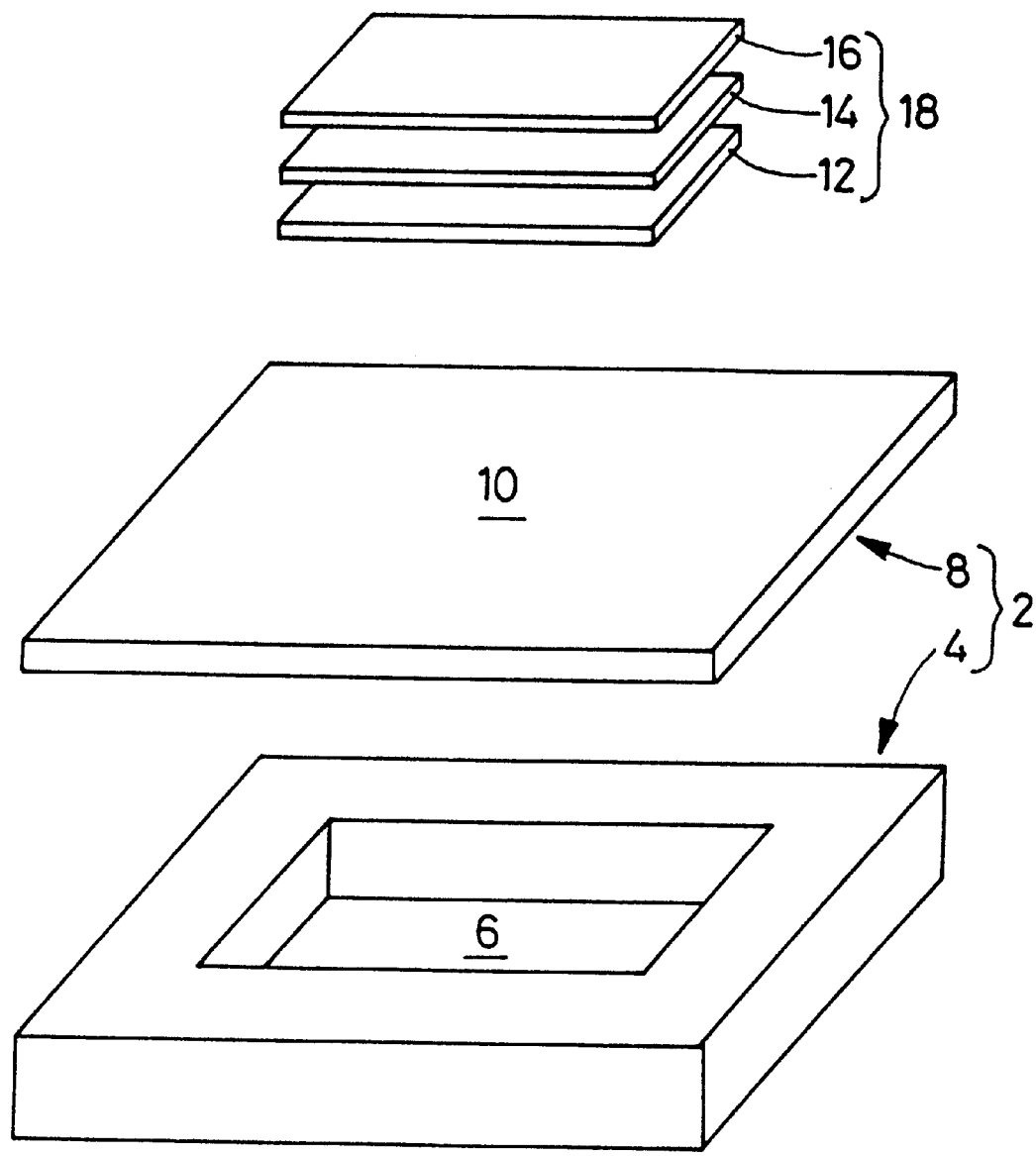
FIG. 1 is an exploded perspective view showing one example of a basic structure of a piezoelectric/electrostrictive film element constructed according to the present invention.
Figure 2:
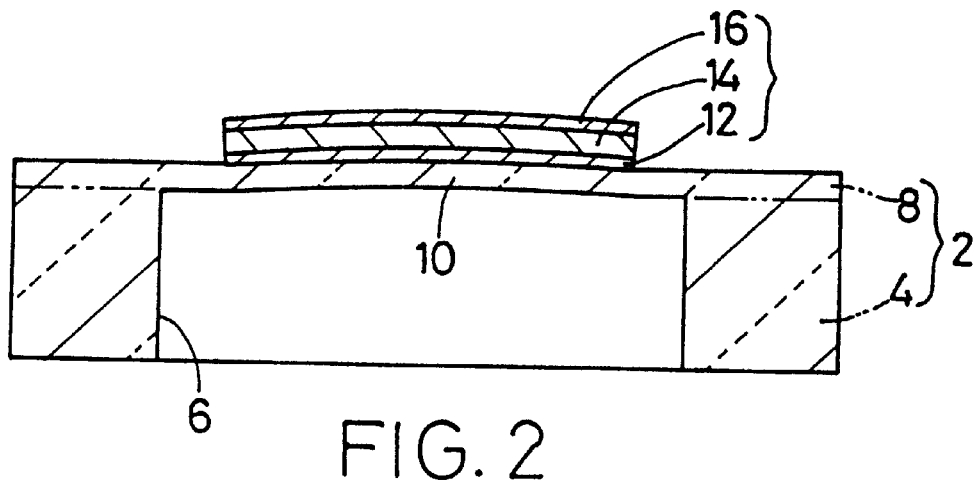
FIG. 2 is a cross sectional view of the piezoelectric/electrostrictive film element of FIG. 1.

Referring to FIGS. 1 and 2 showing one embodiment of a piezoelectric/electrostrictive film element of the present invention, a ceramic substrate 2 has an integral structure which consists of a base plate 4 having a rectangular window 6 of a suitable size, and a relatively thin diaphragm plate 8 for closing the window 6. The diaphragm plate 8 is superposed on one of opposite major surfaces of the base plate 4 which serves as a support member. The diaphragm plate 8 has a diaphragm portion 10 which corresponds to the window 6 of the base plate 4. On an outer surface of the diaphragm portion 10 of the planar ceramic substrate 2, a lower electrode film 12, a piezoelectric/electrostrictive layer (hereinafter referred to as "P/E layer") 14 and an upper electrode film 16 are laminated in this order by a known film-forming method, so as to form a film-like piezoelectric/electrostrictive unit (hereinafter referred to as "P/E unit") 18. As known in the art, a suitable voltage is applied to the lower and upper electrodes 12, 16, through respective lead portions (not shown).

Where the piezoelectric/electrostrictive film element constructed as described above is used as an actuator, a voltage is applied between the two electrodes 12, 16 of the P/E unit 18 in a known manner, so that the P/E layer 14 is exposed to an electric field, and undergoes a mechanical distortion induced by the electric field. Consequently, the P/E unit 18 causes bending or deflecting displacement or force due to the transverse effect of the distortion of the P/E layer 14, such that the displacement or force acts on the ceramic substrate 2 (diaphragm portion 10) in a direction perpendicular to the planar surface of the substrate 2.

Figure 3:
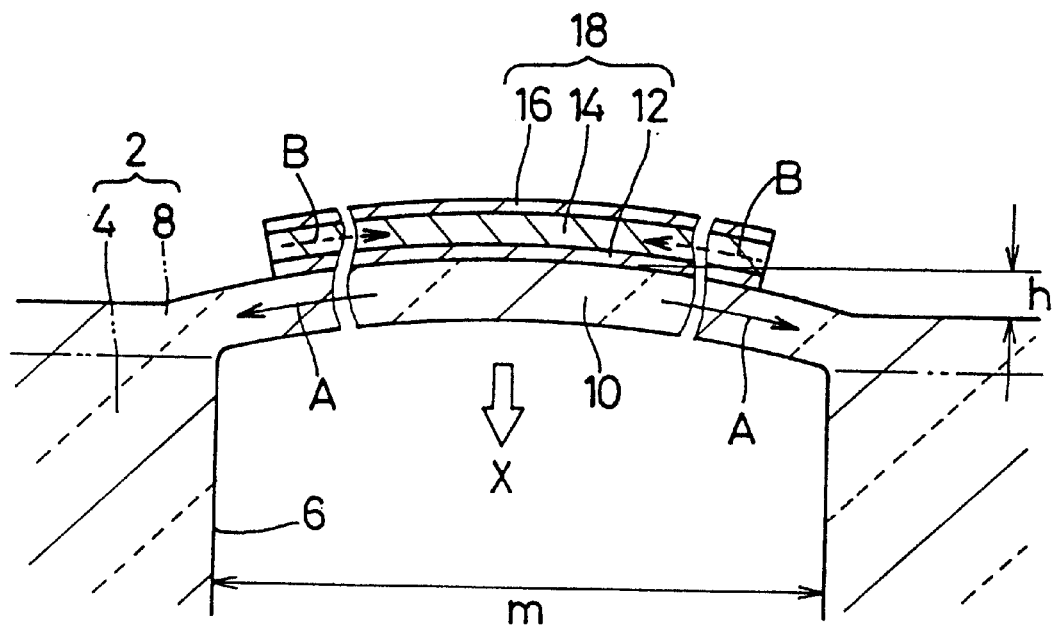
FIG. 3 is an enlarged view showing a cross section of the film element of FIG. 1, which is taken along the shortest path passing the center of a window (the shorter side of the window)

In the present piezoelectric/electrostrictive film element, the diaphragm portion 10 of the ceramic substrate 2 is curved to form a convex shape, in other words, protrudes outwards, i.e., in the direction away from the window 6, as shown in FIG. 3. The P/E unit 18 is formed on the thus curved outer surface of the diaphragm portion 10. Thus, stresses or strains arising in the P/E unit 18 are converted into displacement with high efficiency, and a sufficiently large amount of displacement is ensured even in the case where two or more adjacent P/E units 18 are simultaneously actuated.

Upon actuation of the P/E unit 18 formed on the convex outer surface of the diaphragm portion 10, the film element is displaced downwards or in the "X" direction as indicated in FIG. 3, in other words, is depressed into the window 6. As a result, strains arise in the P/E unit 18, in the direction of dashed arrows designated by "B" in FIG. 3, and forces act on the diaphragm portion 10 at its portion defining the window 6, in the direction of arrows designated by "A" in FIG. 3, which is opposite to the above direction "B", so as to push the base plate 4 of the ceramic substrate 2. Accordingly, the amount of displacement of the element is less likely to be reduced when two or more adjacent P/E units 18 are actuated at the same time, and a difference in the amount of displacement is reduced between when two or more adjacent P/E units 18 are simultaneously actuated and when a single P/E unit 18 is actuated. Further, the rigidness of the diaphragm portion 10 is favorably increased since the P/E unit 18 (more particularly, at least the lower electrode 12 and P/E layer 14) is formed on the convex outer surface of the diaphragm portion 10. The diaphragm portion 10 having such a convex shape has an increased mechanical strength against a force applied in the direction toward the window 6, i.e., applied from the side opposite to the window 6, assuring an increased natural frequency of the diaphragm portion 10 and the P/E unit 18 formed thereon, and an increased operating response speed of the element.

In the present piezoelectric/electrostrictive film element, the amount of protrusion or deflection of the diaphragm portion 10 of the ceramic substrate 2 may be suitably determined so that the above-described objects of the present invention are accomplished. To assure a generally effective amount of displacement of the element, the amount of protrusion is controlled so that the protrusion percentage is represented by $[y=(h/m)\times 100]$ is not higher than 50%, where "h" is the amount of protrusion of a central part of the diaphragm portion 10 or the maximum protruding amount, and "m" is the length of the shortest line which extends across the window 6 of the ceramic substrate 2 and passes the center of the window 6. To obtain a particularly large amount of displacement, the protrusion percentage, that is, the ratio of the maximum amount (h) of protrusion to the length (m) of the shortest line passing the center of the window 6 is controlled to be not higher than 5%, i.e., $(h/m)\times 100 \leq 5$.

The ceramic substrate 2 which bears the P/E unit 18 thereon is made of a known ceramic material, and is favorably selected from stabilized zirconia, partially stabilized zirconia, alumina and mixtures thereof. Particularly favorably used is a material as disclosed by the present inventors in JP-A-5-270912, which contains as a major component zirconia which is partially stabilized by adding a compound(s), such as yttrium oxide, and which has a crystal phase that consists essentially of a tetragonal phase or a combination or mixture of at least two kinds of cubic, tetragonal and monoclinic phases. The ceramic substrate 2 made of the above-described material exhibits high mechanical strength and high toughness even with a small thickness, and is less likely to chemically react with the piezoelectric/electrostrictive material. The ceramic substrate 2 is preferably produced by 1) preparing a green sheet which gives the base plate 4 and which is formed with an aperture (window 6) by use of a metal mold or by ultrasonic machining or mechanical machining, 2) superposing a thin green sheet which gives the diaphragm plate 8 (diaphragm portion 10) on the green sheet for the base plate 4 and bonding the green sheets together by thermo compression, and 3) firing the green sheets into an integral structure. The ceramic substrate 2 thus obtained exhibits high reliability. To assure sufficiently high mechanical strength, the crystal grain size of the ceramic material for the diaphragm portion 10 of the substrate 2 is generally controlled to be not higher than 5 $\mu$m, preferably, 2 $\mu$m. To assure a sufficiently high operating response speed and large displacement of the element, the thickness of the diaphragm portion 10 is generally 50 $\mu$m or smaller, preferably 30 $\mu$m or smaller, and more preferably 15 $\mu$m or smaller.

Each of the green sheets for the base plate 4 and diaphragm plate 8 may consist of a plurality of thin sheets which are superposed on each other. While the window 6 of the ceramic substrate 2 or the diaphragm portion 10 has a rectangular shape in the present embodiment, the shape of the window 6 may be suitably selected from other shapes, such as circular, polygonal and elliptical shapes, and combinations of these shapes, depending upon the application or utility of the piezoelectric/electrostrictive film element. Where the window 6 has a circular shape, rectangular shape or elliptical shape, for example, the above-indicated length (m) of the shortest line which passes the center of the window 6 corresponds to the diameter of the circle, the length of the shorter side of the rectangle, or the length of the minor axis of the ellipse, respectively.

The above-indicated electrodes 12, 16 and the P/E layer 14 are formed by a suitable film-forming method on the diaphragm portion 10 of the ceramic substrate 2 as described above, thereby to provide the P/E unit 18. The P/E layer 14 is suitable formed by a thick-film forming method, such as screen printing, spraying, coating or dipping. The thick-film forming method utilizes a paste or slurry which contains as a main component piezoelectric/electrostrictive ceramic particles having the average particle size of about 0.01 $\mu$m to 7 $\mu$m, preferably, about 0.05 $\mu$m to 5 $\mu$m, so as to form the film-like P/E layer 14 on the diaphragm portion 10 of the ceramic substrate 2. In this case, the resultant film element exhibits excellent piezoelectric/electrostrictive characteristics. Among the above-indicated thick-film forming methods, screen printing is particularly favorably employed since it permits fine patterning at a relatively low cost. The thickness of the P/E layer 14 is preferably 50 $\mu$m or smaller, more preferably in the range of 3 $\mu$m to 40 $\mu$m, to provide a relatively large displacement of the P/E layer 14 with a relatively low voltage.

The upper and lower electrodes 16, 12 of the P/E unit 18 are formed of an electrically conductive material which can withstand oxidizing atmospheres having a considerably high temperature. For instance, the electrodes 12, 16 may be formed of a single metal, an alloy of metals, a mixture of a metal or alloy and an electrically insulating ceramic, or an electrically conductive ceramic. However, the electrode material preferably has a major component which consists of a noble metal high a high melting point, such as platinum, palladium or rhodium, or an alloy, such as silver-palladium alloy, silver-platinum alloy or platinum-palladium alloy. The electrodes 12, 16 may also be formed of a cermet of platinum, and the ceramic material for the substrate 2 or the piezoelectric/electrostrictive material for the P/E layer 14. More preferably, the electrodes 12, 16 are made solely of platinum, or include as a major component an alloy containing the platinum. Where the above-described cermets are used, the content of the substrate material is preferably held within the range of about 6–30% by volume, while the piezoelectric/electrostrictive material is preferably held within the range of about 5–20% by volume.

The electrodes 12, 16 are formed using the above-described conductive material, by a suitably selected one of known film-forming methods which include the thick-film forming methods as indicated above, and thin-film forming methods, such as sputtering, ion-beam method, vacuum vapor deposition, ion plating, CVD and plating. The thick-film forming methods, such as screen printing, spraying, dipping and coating, may be favorably employed for forming the lower electrode 12, while the above-indicated thin-film forming methods as well as the thick-film forming methods may be favorably employed for forming the upper electrode 16. The thickness of the electrodes 12, 16 thus formed is generally not greater than 20 $\mu$m, preferably, not greater than 5 $\mu$m. The total thickness of the P/E unit 18 which is the sum of the thickness of these electrodes 12, 16 and the P/E layer 14 is generally 100 $\mu$m or smaller, preferably, 50 $\mu$m or smaller.

The piezoelectric/electrostrictive material for forming the P/E layer 14 of the P/E unit 18 preferably contains as a major component lead zirconate titantate (PZT), lead magnesium niobate (PMN), lead nickel niobate (PNN), lead manganese niobate, lead antimony stannate, lead zinc niobate, lead titanate, lead magnesium tantalate, lead nickel tantalate, or a mixture thereof. Further, a material (such as PLZT) containing an oxide or other compound of lanthanum, barium, niobium, zinc, cerium, cadmium, chromium, cobalt, antimony, iron, yttrium, tantalum, tungsten, nickel, manganese, lithium, strontium, or bismuth may be added as needed to the above-indicated piezoelectric/electrostrictive material.

Among the piezoelectric/electrostrictive materials as indicated above, it is recommended to sue a material which includes as a major component one of the following mixtures: 1) a mixture of lead magnesium niobate, lead zirconate and lead titanate, 2) a mixture of lead nickel niobate, lead magnesium niobate, lead zirconate and lead titanate, 3) a mixture of lead magnesium niobate, lead nickel tantalate, lead zirconate and lead titanate, and 4) a mixture of lead magnesium tantalate, lead magnesium niobate, lead zirconate and lead titanate. Further, these materials in which a part of lead (Pb) is substituted by strontium and/or lanthanum may be favorably used for the P/E layer 14. These piezoelectric/electrostrictive materials are recommended when the P/E layer 14 is formed by a thick-film forming method, such as screen printing. When the piezoelectric/electrostrictive material having three or more components is used, its piezoelectric/electrostrictive characteristics vary depending upon the composition of the components of the material. However, a three-component material composed of lead magnesium niobate, lead zirconate and lead titanate, or a four-component material composed of lead magnesium niobate, lead nickel tantalate, lead zirconate and lead titanate, or a four-component material composed of lead magnesium tantalate, lead magnesium niobate, lead zirconate and lead titanate preferably has a composition in the vicinity of phase boundaries of a pseudo-cubic crystal phase, a tetragonal crystal phase and a rhombohedral crystal phase.

To assure sufficiently high piezoelectric constant and electromechanical coupling factor, it is particularly desirable to employ one of the following composition, that is, 1) a composition containing 15–50 mol % of lead magnesium niobate, 10–45 mol % of lead zirconate, and 30–45 mol % of lead titanate, 2) a composition containing 15–50 mol % of lead magnesium niobate, 10–40 mol % of lead nickel tantalate, 10–45 mol % of lead zirconate and 30–45 mol % of lead titanate, or 3) a composition containing 15–50 mol % of lead magnesium niobate, 10–40 mol % of lead magnesium tantalate, 10–45 mol % of lead zirconate and 30–45 mol % of lead titanate.

The electrode films and P/E layer (12, 16, 14) formed on the outer surface of the diaphragm portion 10 of the ceramic substrate 2 as described above may be either heat-treated (fired) in different steps after each of these films and layer is formed, for integration with the substrate 2, or concurrently heat-treated (fired) in a single step for integration with the substrate 2 after all of the films and layer are formed on the diaphragm portion 10. Further, the heat-treatment (firing) of the electrode films (12, 16) may not be required depending upon the method of forming these films. The temperature of the heat treatment (firing) for integration of the electrode films and P/E layer with the diaphragm portion is generally controlled to be in the range of 500° C. to 1400° C., preferably, in the range of 1000° C. to 1400° C. To avoid changes in the composition of the piezoelectric/electrostrictive material of the P/E layer 14 at a high temperature, it is desirable to heat-treat of fire the P/E layer 14 while controlling the firing atmosphere to include the evaporation source of the piezoelectric/electrostrictive material. It is also recommended to fire the P/E layer 14 while it is covered with a suitable covering member so that the surface of the layer 14 is not directly exposed to the firing atmosphere. The covering member may be formed of a material similar to that of the ceramic substrate 2.

Figure 4A:
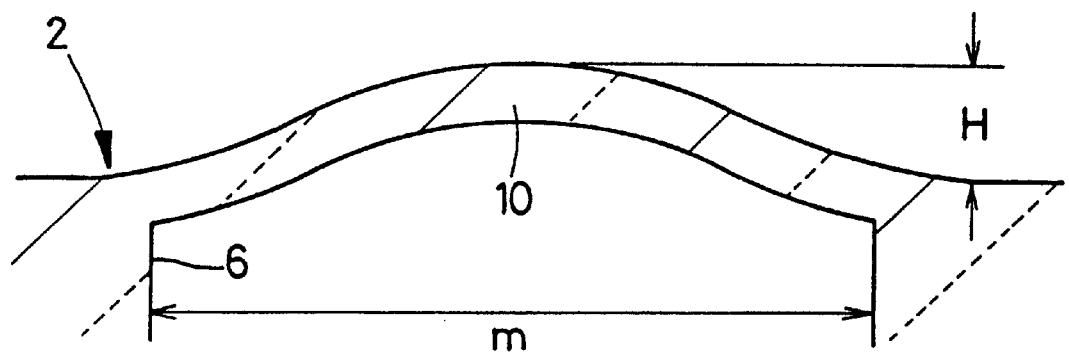
FIG. 4(a) is an enlarged view in partial cross section, showing one process step of a method of producing the piezoelectric/electrostrictive element of the present invention.
Figure 4B:
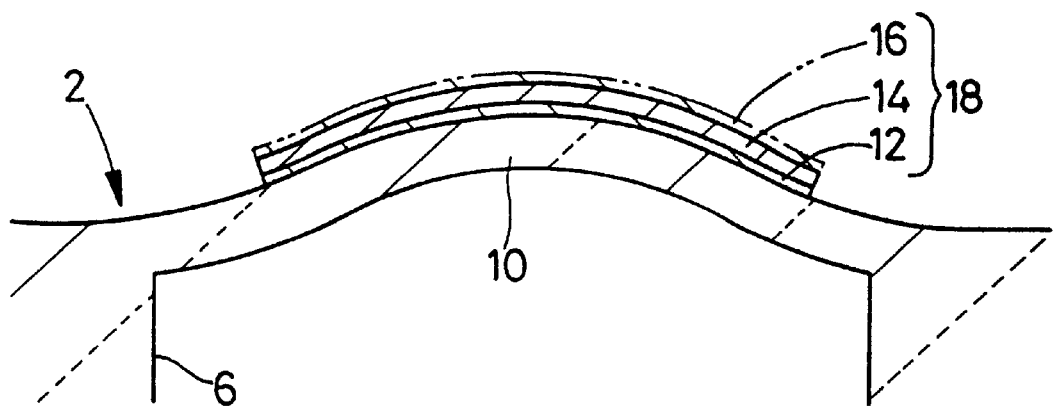
FIG. 4(b) is a view corresponding to FIG. 4(a), showing another process step of the method of producing the film element.
Figure 4C:
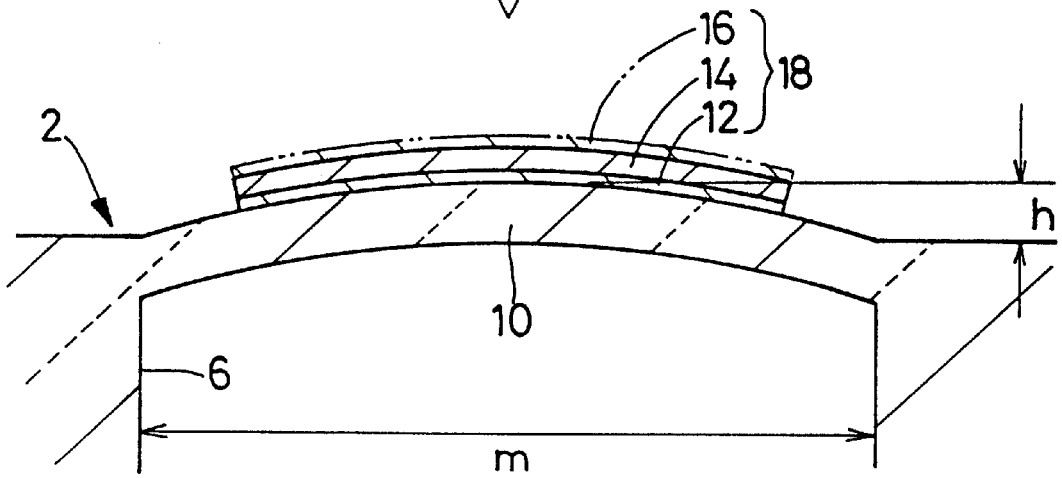
FIG. 4(c) is a view corresponding to FIG. 4(a), showing a further process step of the method of producing the film element.

The piezoelectric/electrostrictive film element constructed as described above may be produced by various methods known to those skilled in the art, including the following three methods. In the first method, the diaphragm portion 10 of the ceramic substrate 2 is convexed upon firing of the P/E layer 14 of the P/E unit 18, by controlling coefficients of the thermal expansion of the ceramic substrate 2 and P/E unit 18. In the second method, a pressing force is applied to the diaphragm portion 10 when the P/E layer 14 of the P/E unit 18 is fired, so that the diaphragm portion 10 has a convex shape. In the third method, the diaphragm portion 10 is convexed upon formation of the P/E unit 18 (more specifically, at least the lower electrode 12 and P/E layer 14), by controlling the above coefficients of the thermal expansion of the substrate 2 and P/E unit 18 while taking account of the firing shrinkage of the P/E layer 14. Preferably, there is initially prepared a ceramic substrate 2 which has a convex diaphragm portion 10 which protrudes outwards, as shown in FIG. 4(*a*), and a P/E unit 18 is then formed on the outer surface of the convex diaphragm portion 10. This method is advantageously employed in view of relatively high production efficiency.

According to the preferable method as described above, the ceramic substrate 2 initially prepared has the convex diaphragm portion 10, which protrudes outwards, that is, in the direction away from the window 6, by an amount "H" as indicated in FIG. 4(*a*). Then, the lower electrode 12 and the P/E layer 14 are successively laminated on the outer surface of the convex diaphragm portion 10, by a suitable film-forming method, as shown in FIG. 4(*b*). After the upper electrode 16 is formed as needed, the P/E layer 14 is fired, thereby to provide the piezoelectric/electrostrictive film element of the present invention, as shown in FIG. 4(*c*). The firing shrinkage of the P/E layer 14 which occurs upon firing thereof is absorbed by the convex diaphragm portion 10 which protrudes outwards by a relatively large amount (H), whereby the amount of protrusion of the diaphragm portion 10 is reduced to a value "h" (which is smaller than "H"), as shown in FIG. 4(*c*), after firing of the P/E layer 14. Accordingly, stresses which arise in the P/E layer 14 due to its firing shrinkage are effectively reduced, and sintering of the P/E layer 14 effectively progresses, thus assuring an improved density of the P/E layer 14.

The ceramic substrate 2 used in the above method, which has the convex diaphragm portion 10 as shown in FIG. 4(*a*), can be easily obtained by controlling the firing rate or speed or the shrinkage percentage of the base plate 4 and diaphragm plate 8 (FIGS. 1 and 2), or suitably selecting the shape of the diaphragm plate 8 before its firing, or making use of a difference in the coefficients of the thermal expansion of the two plates 4, 8. More specifically, the diaphragm portion 10 protrudes outwards when sintering of a green sheet which gives the diaphragm plate 8 precedes sintering of a green sheet which gives the base plate 4, or when the shrinkage percentage measured upon firing or sintering of the green sheet for the base plate 4 is greater than that of the green sheet for the diaphragm plate 8.

While the amount "H" of protrusion of the diaphragm portion 10 of the ceramic substrate 2 is suitably determined depending upon the firing shrinkage of the P/E layer 14, and a desired amount (h) of protrusion of the diaphragm portion 10 of the final product, the amount "H" is generally 1–55% of the above-indicated length (m) of the shortest line which passes the center of the window 6, preferably 2–10% of the same length (m). If the protrusion amount "H" is too small, the diaphragm portion 10 is depressed into the window 6 upon firing of the P/E layer 14. If the protrusion amount "H" is too large, the diaphragm portion 10 of the resulting film element cannot undergo a sufficiently large displacement upon actuation of the P/E unit 18.

In the above-described method, the lower electrode film, P/E layer and upper electrode film 12, 14, 16 are formed on the outer surface of the diaphragm portion 10 of the ceramic substrate 2, by the above-indicated film-forming method(s), and then fired at the above-indicated firing temperature, thereby to provide respective films and layer having desired thickness values. Thus, the P/E unit 18 is formed integrally on the diaphragm portion 10. While the P/E layer 14 is desirably fired just after it is formed on the lower electrode 12, that is, before the upper electrode 16 is formed, the firing of the P/E layer 14 may be effected after the upper electrode 16 is formed on the layer 14.

In the piezoelectric/electrostrictive film element thus obtained according to the present invention, the diaphragm portion 10 of the ceramic substrate 2 has a convex shape or protrudes outwards, which leads to advantageous features, such as increased rigidity, increased mechanical strength and an increased natural frequency of the diaphragm portion 10, and an improved operating response speed of the film element. Further, when a plurality of P/E units 18 are provided in respective diaphragm portions 10 of the ceramic substrate 2, the amount of displacement of each diaphragm portion 10 which occurs when two or more adjacent P/E units 18 are simultaneously actuated in almost equal to the amount of displacement which occurs when only one P/E unit 18 is actuated. This feature is particularly advantageous when the film element is used for sensors, actuators and other applications.

The present piezoelectric/electrostrictive film element, which effectively undergoes displacement upon actuation of the P/E unit 18 formed on the outer surface of the diaphragm portion 10, is advantageously used for various purposes. For example, the film element of the present invention may be advantageously used as filters, various sensors such as an acceleration sensor or a shock sensor, transformers, microphones, sounding bodies, such as a loudspeaker, and various vibrators and resonators for power devices and communication devices. Further, the film element may be particularly advantageously used as a uni-morph, bi-morph or other type of piezoelectric/electrostrictive actuators which produce displacement in the form of bending or deflection, and are used for display devices, servo-displacement elements, pulse-driven motors, ultrasonic motors and others, which elements and motors are described in "FUNDAMENTALS TO APPLICATIONS OF PIEZOELECTRIC/ELECTROSTRICTIVE ACTUATORS", Kenji Uchino, Japan Industrial Technology Center, published by Morikita-shuppan.

Figure 5:
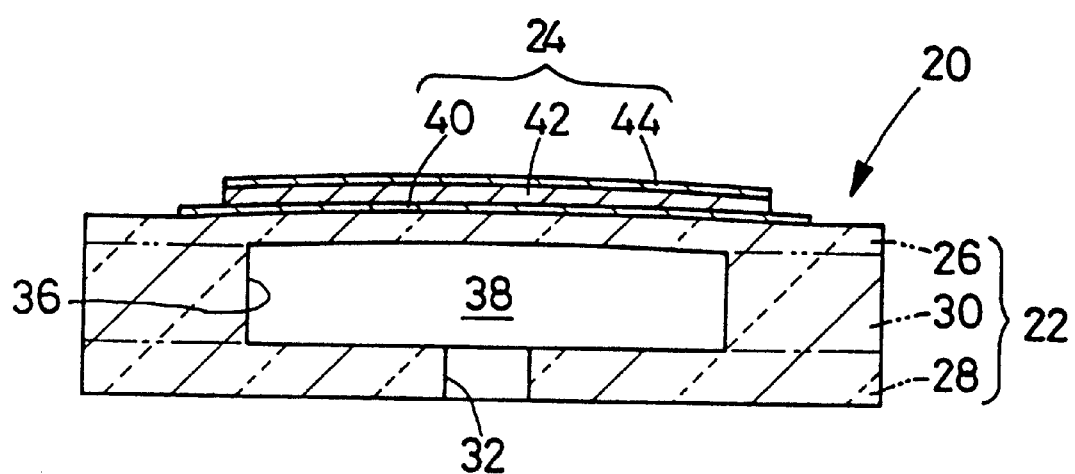
FIG. 5 is a cross sectional view showing one example of the piezoelectric/electrostrictive film element of the present invention.
Figure 6:
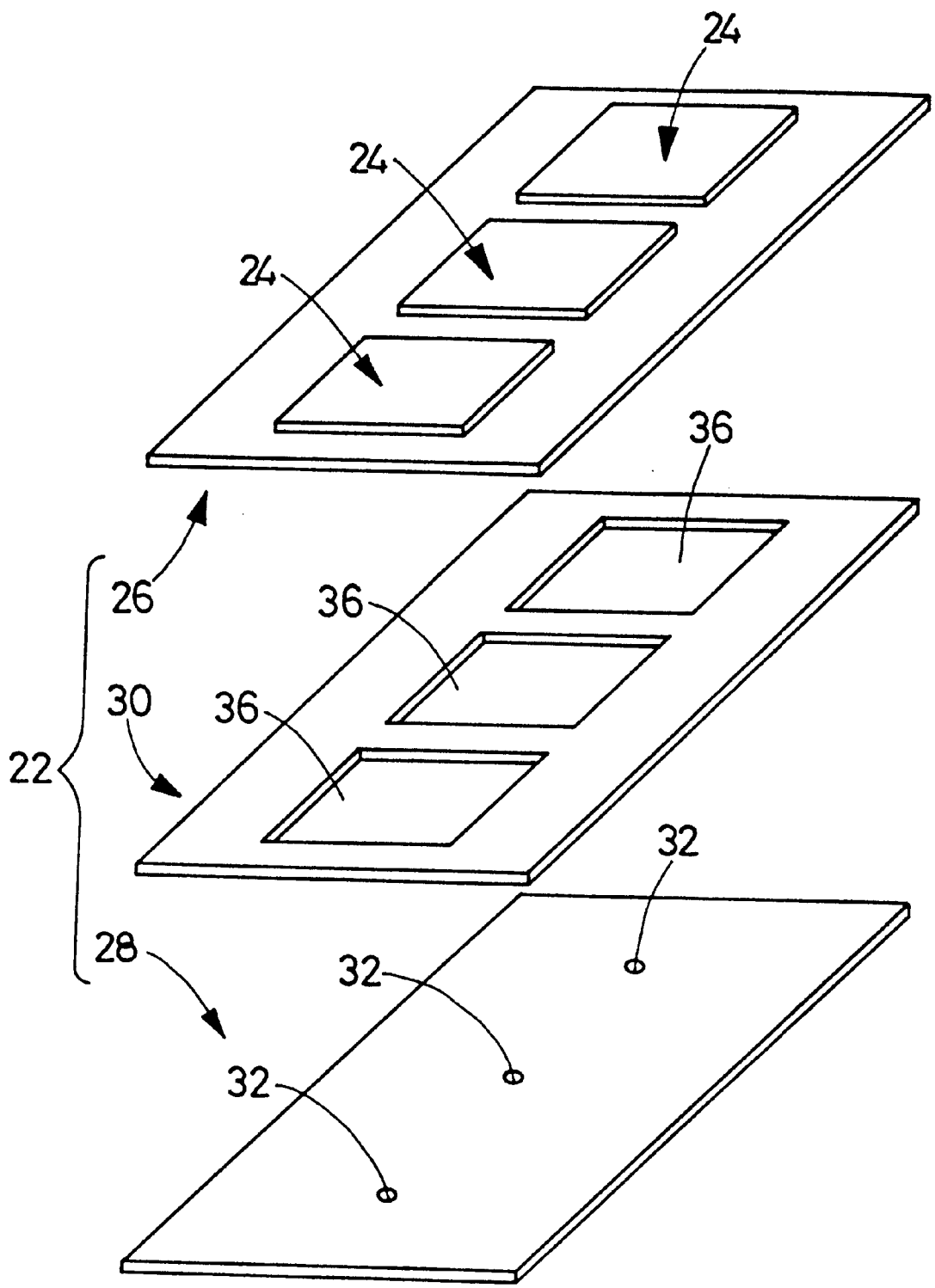
FIG. 6 is an exploded perspective view showing the piezoelectric/electrostrictive film element as shown in FIG. 5.

Referring next to FIG. 5 schematically showing an example of a piezoelectric/electrostrictive film element according to the present invention, and to FIG. 6 which is an exploded perspective view of the film element, the piezoelectric/electrostrictive film element 20 has an integral structure which includes a ceramic substrate 22 and a plurality of piezoelectric/electrostrictive units (hereinafter referred to as "P/E units") 24 formed on convex outer surfaces of thin-walled diaphragm portions (26) of the substrate 22. In operation, each of the diaphragm portions (26) of the ceramic substrate 22 is deflected or deformed upon application of a voltage to the corresponding P/E unit 24.

Figure 7:
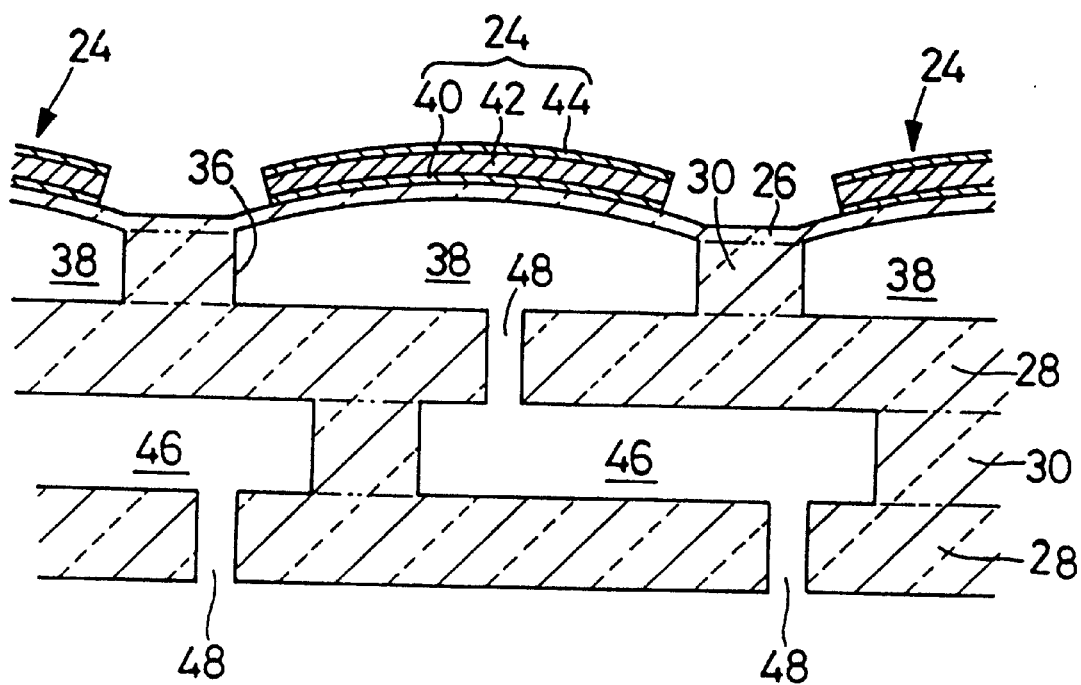
FIG. 7 is a cross sectional view showing another example of the piezoelectric/electrostrictive film element which has a five-layer structure.

More specifically, the ceramic substrate 22 has an integral laminar structure which consists of a relatively thin closure plate (diaphragm plate) 26, a connecting plate (base plate) 28, and a spacer plate (base plate) 30 interposed between the closure and connecting plates 26, 28. These plates 26, 28, 30 are formed of a zirconia material. The connecting plate 28 has three communication holes 32, which are formed through the thickness of the plate 28 with a suitable spacing therebetween. The number, shape, dimensions, position and other parameters of the communication holes 32 may be suitably determined, depending upon a specific application of the film element 20. The spacer plate 30 is formed with a plurality of square windows 36 (three in this embodiment). This spacer plate 30 is superposed on the connecting plate 28 such that the communication holes 32 of the connecting plate 28 communicate with the respective windows 36. The closure plate 26 is superposed on one major surface of the spacer plate 30 remote from the connections plate 28, so as to close openings of the windows 36 of the spacer plate 30. With the closure plate 26, spacer plate 30 and connecting plate 28 thus superposed on each other, three pressure chambers 38 are formed within the ceramic substrate 22, such that the chambers 38 communicate with an exterior space through the respective communication holes 32. The ceramic substrate 22 is an integral fired body formed of a suitable ceramic material, such as a zirconia material, as described above. While the ceramic substrate 22 of the instant embodiment is a three-layer integral structure consisting of the closure plate 26 (diaphragm plate), spacer plate 30 (base plate) and connecting plate 28 (base plate), the substrate may be formed as a four-layer or other multi-layer integral structure having four or more layers or plates, as illustrated in FIG. 7.

Film-like P/E units 24 are formed on the outer surface of the closure plate 26, such that the units 24 are aligned with the respective pressure chambers 38 as viewed in the plane parallel to the closure plate 26. Each of the P/E units 24 includes a lower electrode 40, a piezoelectric/electrostrictive layer (hereinafter referred to as "P/E layer") 42, and an upper electrode 44, which are successively formed by a suitable film-forming method or methods on a portion of the closure plate 26 which is located in alignment with one of the windows 36 of the spacer plate 30, that is, on the outer surface of one diaphragm portion of the ceramic substrate 22. In operation, the pressure in the pressure chamber 38 is increased upon actuation of the corresponding P/E unit 24, so that a fluid contained in the pressure chamber 38 can be effectively discharged through the corresponding communication hole 32. The piezoelectric/electrostrictive film element 20 thus constructed may be used not only as an actuator but also as a sensor or the like, which is adapted to generate a voltage signal that represents flexural displacement of the diaphragm portion (26) of the ceramic substrate 22.

While the piezoelectric/electrostrictive film elements according to the present invention may be used as actuators and sensors, particularly advantageously for use as a member of display devices, loudspeakers, servo-displacement elements, ultrasonic sensors, acceleration sensors and shock sensors, it is to be understood that the present film element may also be favorably used for other known applications.

[EXAMPLES]

To further clarify the present invention, some examples of the piezoelectric/electrostrictive film element of the present invention will be hereinafter described. However, it is to be understood that the present invention is not limited to details of the following examples, but may be embodied with various changes, modifications and improvements which may occur to those skilled in the art, without departing from the principle and scope of the invention as defined in the attached claims.

Example 1

Initially, there was prepared a rectangular ceramic substrate having four rectangular windows each of which had a size of 0.5 mm×0.7 mm. The rectangular windows were arranged such that the short sides (having a length of 0.5 mm) of the windows extend in the longitudinal direction of the substrate, as shown in FIG. 6, and such that the windows were equally spaced from each other at intervals of 0.2 mm. The windows were closed by respective 10 $\mu$m-thick diaphragm portions of the substrate. The diaphragm portions and base portion of the ceramic substrate were formed from a powder of zirconia partially stabilized by yttria, which had the average particle size of 0.4$\mu$m. The partially stabilized zirconia powder was formed into green sheets, which were then fired by a known method. The base portion of the substrate had a thickness of 200 $\mu$m when measured after firing of the substrate.

On an outer surface of each of the diaphragm portions of the ceramic substrate, a platinum paste was printed by screen printing, dried at 120° C. for 10 min., and fired at 1350° C. for two hours, to provide a lower electrode having a thickness of 5 $\mu$m. Then, a piezoelectric/electrostrictive layer was formed on the lower electrode, using a piezoelectric/electrostrictive material that is composed of lead magnesium niobate, lead zirconate and lead titantate. This material was printed by screen printing, dried at 120° C. for 20 min., and fired at 1300° C., to provide the piezoelectric/electrostrictive layer having a thickness of 30 $\mu$m. With the lower electrode and P/E layers thus formed on the respective diaphragm portions of the ceramic substrate, an alumina pin having a convex shape was fitted into each of the windows of the substrate, so as to press or push against the inner surface of the corresponding diaphragm portion which partially defines the window. In this state, the ceramic substrate was re-fired at 1300° C., so that each of the diaphragm portions protruded outwards by an amount (h) of 20 $\mu$m.

Thereafter, a Cr thin film and a Cu thin film were formed by sputtering on the lower electrode and P/E layer formed on each of the convex diaphragm portions of the ceramic substrate, so as to provide an upper electrode having a total thickness of 0.3 $\mu$m. In this manner, an intended piezoelectric/electrostrictive film element according to the present invention was obtained. The thus obtained film element was subjected to polarization treatment by applying 100 V between the upper and lower electrodes of each piezoelectric/electrostrictive unit.

As a comparative example, a conventional piezoelectric/electrostrictive film element was produced using the ceramic substrate prepared as described above, and attaching a 30 $\mu$m-thick plate made of a piezoelectric/electrostrictive material to each diaphragm portion of the substrate, by means of conductive adhesives.

To evaluate the piezoelectric/electrostrictive characteristics of the present and conventional film elements as described above, a voltage of 30 V was applied between the upper and lower electrodes of each of the P/E units of each element, in the same direction in which the above polarization treatment was effected, and the amount of displacement of the relevant P/E unit was measured by a laser Doppler device. In this manner, all of the four P/E units were actuated one by one, and the first average of the displacements of these P/E units was calculated. At the same time, the natural frequency of the diaphragm portions of the ceramic substrate of each element was measured. Similarly, a voltage of 30 V was applied to all of the four P/E units of each element for simultaneous actuation thereof, and the amounts of displacement of the respective P/E units were measured. The second average of the amounts of displacement of the four P/E units that were actuated at the same time was also calculated. Based on the thus obtained results, there was calculated at the ratio (%) of the displacement measured upon actuation of all the P/E units (whole actuation) to the displacement measured upon actuation of a single P/E unit (single actuation), as represented by (the second average/the first average)×100 (%). Further, a breaking load was measured by pressing a 0.2 mm-diameter indenter against the outer surface of the P/E unit located on a central part of each of the diaphragm portions of each element, in the direction toward the inside of the corresponding window. The results of the above measurements are indicated in TABLE 1 below.

TABLE 1

| Sample No. | Whole actuation/ Single actuation | Natural frequency | Breaking load | Single actuation |
| --- | --- | --- | --- | --- |
| 1* | 100% | 400 kHz | 150 g | 0.25 $\mu$m |
| 2* | 50% | 250 kHz | 30 g | 0.18 $\mu$m |

No. 1: piezoelectric/electrostrictive film element of the present invention
No. 2: conventional piezoelectric/electrostrictive film element It will be apparent from the results indicated in TABLE 1 that the piezoelectric/electrostrictive film element of the present invention, in which the P/E units were formed on the convex outer surfaces of the diaphragm portions of the ceramic substrate, exhibited substantially the same amount of displacement in the cases where all the P/E units were simultaneously actuated and where only one P/E unit was actuated. This is a great improvement over the conventional piezoelectric/electrostrictive element for which the ratio of the displacement measured upon actuation of all the P/E units to the displacement measured upon actuation of a single P/E unit was 50%. The film element of the invention also exhibited a remarkably increased natural frequency and improved breaking strength of the diaphragm portions, compared to the conventional element.

Example 2

Initially, a ceramic powder, which had the average particle size of 0.4 $\mu$m and was composed of 80% by weight of a zirconia powder partially stabilized by a 3 mol % of yttria, and 20% by weight of alumina, was mixed by a known method with a binder, plasticizer and an organic solvent, so as to prepare a slurry. This slurry was formed by doctor blade method into a green sheet, which provides after firing the base plate of the ceramic substrate having a thickness of 200 $\mu$m.

On the other hand, a zirconia powder, which was partially stabilized by 3 mol % of yttria and had the average particle size of 0.3 $\mu$m, was mixed by a known method with a binder, plasticizer and an organic solvent, to prepare a slurry. This slurry was formed by a reverse roll coater machine into a green sheet, which provides after firing the diaphragm plate of the substrate having a thickness of 10 $\mu$m.

Thereafter, the green sheet for the base plate was punched according to a pattern by means of a suitable metal mold, so as to form the windows. Then, the green sheet for the diaphragm plate was superposed on the green sheet for the base plate, and bonded together by thermo-compression under the pressure of 100 kg/cm$^2$ at 80° C. for 1 min. The thus obtained integral laminar structure was fired at 1500° C. for two hours, to provide the ceramic substrate with the diaphragm portions protruding outwards by an amount (H) of 30 $\mu$m.

Subsequently, the lower electrode and P/E layer were formed on the outer surface of each of the convex diaphragm portions of the thus obtained ceramic substrate, in the same manner as employed in EXAMPLE 1. After firing of the lower electrode and P/E layer, the amount of protrusion of the diaphragm portions was reduced to about 20 $\mu$m (=h). Then, the upper electrode was formed on the fired P/E layer of each P/E unit, in the same manner as employed in EXAMPLE 1, so as to provide a piezoelectric/electrostrictive film element constructed according to the present invention.

With respect to the thus obtained film element, the ratio of the displacement upon actuation of all the P/E units to the displacement upon actuation of a single P/E unit, and the natural frequency and breaking strength of the diaphragm portions were measured in the same manner as in EXAMPLE 1. The results of the measurements indicated that the present film element exhibited excellent characteristics as obtained with respect to the element of EXAMPLE 1.

Example 3

Another example of piezoelectric/electrostrictive film element was produced in the same manner as in Example 1, except that an alumina pin having a different convex shape (different amount of protrusion) was pressed against the diaphragm portions of the ceramic substrate when the substrate was re-fired. With the use of the alumina pin, the diaphragm portions of the resultant film element protruded outwards by 40 $\mu$m (=h).

With respect to the thus obtained film element, the ratio of the displacement upon actuation of all the P/E units to the displacement upon actuation of a single P/E unit, and the natural frequency and breaking strength of the diaphragm portions were measured in the same manners as in EXAMPLE 1. The results of the measurements are indicated in TABLE 2 below, in which the measurement results obtained with respect to the film element of the present invention produced according to EXAMPLE 1 are also indicated.

TABLE 2

| Sample No. | Whole actuation/ Single actuation | Natural frequency | Breaking load | Single actuation |
| --- | --- | --- | --- | --- |
| 3* | 100% | 600 kHz | 200 g | 0.16 $\mu$m |
| 1* | 100% | 400 kHz | 150 g | 0.25 $\mu$m |

No. 3: P/E film element of EXAMPLE 3 of the present invention, having diaphragm portions whose protrusion percentage [(h/m) × 100 (%)] is 8%
No. 1: P/E film element of EXAMPLE 1 of the present invention, having diaphragm portions whose protrusion percentage [(h/m) × 100 (%)] is 4%

It will be apparent from the above results that the diaphragm portions of the film element of EXAMPLE 3 having a protrusion percentage of 8% exhibited a higher natural frequency and increased breaking strength, as compared with the film element of EXAMPLE 1 whose diaphragm portions had a protrusion percentage of 4%. However, the film element of EXAMPLE 1 exhibited a greater amount of displacement when a single P/E unit was actuated.

What is claimed is:

1. A method of producing a piezoelectric/electrostrictive film element comprising:

a ceramic substrate having at least one window, and a diaphragm portion formed as an integral part thereof, for closing each of said at least one window, said diaphragm portion having a convex shape and protruding outwards, in a direction away from a corresponding one of said at least one window; and a film-like piezoelectric/electrostrictive unit including a lower electrode, a piezoelectric/electrostrictive layer and an upper electrode, which are formed in lamination in the order of description on a convex outer surface of said diaphragm portion by a film-forming method, wherein said convex shape of the diaphragm portion is provided in an unbiased state of the piezoelectric/electrostrictive unit, said method comprising:

preparing a ceramic substrate that has at least one diaphragm portion each of which has a convex shape and protrudes outwards, in a direction away from a corresponding one of said at least one window;

forming a lower electrode and a piezoelectric/electrostrictive layer on a convex outer surface of each of said at least one diaphragm portion by a film-forming method;

firing said piezoelectric/electrostrictive layer so that said lower electrode and said piezoelectric/electrostrictive layer are formed integrally on said convex outer surface of said each diaphragm portion; and forming said upper electrode on said piezoelectric/electrostrictive layer by a film-forming method, thus producing a piezoelectric/electrostrictive film element comprising:

a ceramic substrate having at least one window, and a diaphragm portion formed as an integral part thereof, for closing each of said at least one window, said diaphragm portion having a convex shape and protruding outwards, in a direction away from a corresponding one of said at least one window; and a film-like piezoelectric/electrostrictive unit including a lower electrode, a piezoelectric/electrostrictive layer and an upper electrode, which are formed in lamination in the order of description on a convex outer surface of said diaphragm portion by a film-forming method, wherein said convex shape of the diaphragm portion is provided in an unbiased state of the piezoelectric/electrostrictive unit.

2. A method as defined in claim 1, wherein said upper electrode is formed on said piezoelectric/electrostrictive layer before firing of the piezoelectric/electrostrictive layer.

3. A method as defined in claim 1, wherein said each diaphragm portion of said ceramic substrate protrudes outwards by an amount which is in a range of 1–20% of a length of a shortest line which extends across a corresponding one of said at least one window and passes a center of the window.

* * * * *